(12) United States Patent
Surendra et al.

(10) Patent No.: US 6,365,326 B1
(45) Date of Patent: *Apr. 2, 2002

(54) PATTERN DENSITY TAILORING FOR ETCHING OF ADVANCED LITHOGRAPHIC MASK

(75) Inventors: Maheswaran Surendra, Croton-on-Hudson, NY (US); Douglas E. Benoit; Cameron J. Brooks, both of South Burlington, VT (US)

(73) Assignees: International Business Machines Corporation, Armonk, NY (US); Lockheed Martin Corporation, Manassas, VA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/307,126
(22) Filed: May 7, 1999
(51) Int. Cl.$^7$ .................................................. G03C 5/00
(52) U.S. Cl. .............................. 430/313; 430/5; 430/318
(58) Field of Search .................................. 430/5, 311, 313, 430/296, 314, 312, 315, 316, 317, 318, 322, 323, 324

(56) References Cited

U.S. PATENT DOCUMENTS

| | | | |
|---|---|---|---|
| 5,079,112 A | * | 1/1992 | Berger et al. .................. 430/4 |
| 5,278,105 A | | 1/1994 | Eden et al. .................. 437/250 |
| 5,464,711 A | | 11/1995 | Mogab et al. .................. 430/5 |
| 5,607,733 A | | 3/1997 | Fukuda et al. .............. 427/585 |
| 5,751,780 A | | 5/1998 | Fukuda et al. ................ 378/35 |
| 5,754,619 A | | 5/1998 | Yoshihara et al. ............. 378/35 |
| 5,773,177 A | | 6/1998 | Ikeda et al. .................... 430/5 |
| 5,942,760 A | * | 8/1999 | Thompson et al. ...... 250/492.2 |

FOREIGN PATENT DOCUMENTS

JP            0198732            9/1986

* cited by examiner

Primary Examiner—Mark F. Huff
Assistant Examiner—Saleha R. Mohamedulla
(74) Attorney, Agent, or Firm—DeLio & Peterson, LLC; Kelly M. Reynolds; Howard J. Walter, Jr.

(57) ABSTRACT

A method of preparing an x-ray mask comprising providing a substrate, and applying sequentially to a surface of the substrate i) an etch stop layer resistant to etchant for an x-ray absorber, and ii) an x-ray absorber layer. The method then includes removing a portion of the substrate below the layers to create an active region of the substrate above the removed portion of the substrate and an inactive region over remaining portions of the substrate, applying a resist layer above the absorber layer, and exposing a portion of the resist layer using electron beam irradiation and developing the resist layer to form a latent mask image over the active region of the substrate. The method then includes removing the exposed portion of the resist layer to leave a resist layer mask image over the active region of the substrate, and etching the absorber layer to leave an absorber layer mask image over the designated active region of the substrate while simultaneously removing the absorber layer from the inactive region to form, for example, an x-ray mask, on the substrate.

20 Claims, 4 Drawing Sheets

PATTERN DENSITY TAILORING FOR ETCHING OF ADVANCED LITHOGRAPHIC MASK

The United States Government has rights in this invention pursuant to Advanced Research Projects Agency (ARPA) Advanced Lithography Program contract (#N00019-94-C-0035) between ARPA and Loral Federal Systems Company.

BACKGROUND OF THE INVENTION

1. Field of the Invention

The present invention relates to a method of forming image segments in a lithographic process and, in particular, to a method of preparing a mask for use in x-ray lithography.

2. Description of Related Art

As device dimensions continue to shrink, advanced lithographic methods are being developed to replace conventional optical lithography. Robust and effective etch processes are required to pattern submicron (<0.1 µm width) features on masks used for advanced lithography. This is particularly important on masks used for 1x x-ray lithography since there is no demagnification of the mask during exposure. Of paramount importance is the selection of a refractory film stack (absorber and hardmask layers) that satisfies the stringent film stress requirements and has good etching characteristics. The absorbing layer is typically an amorphous material composed of a refractory metal, such as tantalum or tungsten. The absorbing layer could also include portions of silicon, geranium or boron, and possibly nitrogen which is incorporated to ensure an amorphous structure. The hardmask layer is typically a chromium, chromium nitride, or silicon oxynitride (SiON) film, but may also be any other film which has good stress characteristics and high etch selectivity to the absorber layer.

Masks are typically fabricated by patterning the hardmask layer from resist images with a plasma etch followed by a second high density plasma etch to define the absorber images. Since x-ray masks consist of membranes formed in the central area of wafers, the actual patterned area represents a smaller fraction of the actual wafer surface area; as little as 10% of the wafer surface area in some cases. If a certain mask pattern with 20% coverage was exposed, it would result in 2% total pattern density on the x-ray mask. Refractory metal etches are very challenging when the mask pattern density is this small. Very aggressive etches are required to pattern sub-0.25 µm features on low pattern density masks, and even in these cases, the resulting image quality can be poor.

Typically in the prior art, a tantalum silicon etch utilizes high power on the order of 70 to 100 watts at higher temperatures of 50–70° C. Such etch has typically low selectivity to SiON on the order of less than four to one. Image size is generally difficult to achieve for images less than 180 nm and is typically actually 130 to 160 nm for 180 nm nominal images. Additionally, vertical side walls are difficult for images less than 180 nm and there is usually a lower resolution for some optical endpoint systems.

A typical prior art process for producing a dark field x-ray mask is depicted in FIGS. 1 and 2. In FIG. 1 a substrate 20 made of silicon or the like has layered on the upper and lower surfaces a membrane layer 22 of silicon carbide, boron-doped silicon, diamond film or the like. The wafer substrate 20 has an etched or cut out region 21 on its lower surface to expose the lower surface of upper membrane layer 22. The region on the wafer upper surface above the etched out area 21 is referred to as active area 60, while the region on the wafer upper surface outside the active area above the substrate thickness is referred to as inactive area 70. The mask is formed in the active area of the substrate and lithographic exposure is carried out through the active area. The wafer is mounted on a pyrex ring 30 for handling purposes.

Above the upper membrane layer 22 there is applied, in sequence and directly over each lower layer, an optional etch stop layer 24 of chromium, an x-ray absorber layer 26 typically of tantalum silicon (TaSi) or other absorber, a hardmask layer 28 typically of SiON (or Cr) and a resist layer 32. Resist layer 32 is shown having openings 34 created by electron beam exposure, baking, developing and removal of these regions which will eventually form the mask. These layers are usually applied before the lower surface is etched out.

After first etching the hardmask layer 28 and then the absorber layer 26, FIG. 2 shows the resultant mask with the resist layer and hardmask layer stripped by conventional means. In the case of a dark field mask, there is left an x-ray mask having the absorber layer 26 completely covering the inactive area 70 and covering only selected portions of the active area 60.

Bearing in mind the problems and deficiencies of the prior art, it is therefore an object of the present invention to provide an improved method of forming image segments for lithographic masks, and in particular for low pattern density x-ray lithography masks or other advanced lithography such as SCALPEL (Scattering with Angular Limitation Projection E-beam Lithography) or EUV (Extreme Ultra-violet Lithography).

It is another object of the present invention to provide a method of preparing lithography image segments and masks which utilize lower power and lower temperature in the etching of the absorber or similar layer on the mask.

It is a further object of the invention to provide an improved method of forming image segments and lithography masks which may accommodate smaller image sizes and provide more vertically etched sidewalls.

SUMMARY OF THE INVENTION

The above and other objects and advantages, which will be apparent to one of skill in the art, are achieved in the present invention which is directed to, in a first aspect, a method of forming image segments comprising providing a workpiece having active and inactive surface regions; applying a photoresist over the workpiece covering both active and inactive regions and exposing and developing at least the active region to create mask pattern images. The method then comprises removing photoresist from at least a portion of the inactive region and removing portions of the workpiece using the remaining photoresist as a mask to form image segments in the active region.

The photoresist may be a positive or negative photoresist and the image segments may be used to form a dark field x-ray mask. The mask pattern images of the active region may be patterned by electron beam or UV irradiation. The method may include blocking the active region, for example, by masking, while exposing and developing the inactive region with electron beam irradiation or UV light to remove photoresist.

The method may include applying an absorber, for example, an x-ray absorber, prior to applying the resist and using the remaining photoresist as a mask to leave portions of the absorber on the workpiece to form a lithographic mask. A hardmask layer may be applied to the workpiece prior to the photoresist and the method then includes the step of removing portions of the hardmask layer using the remaining photoresist as a mask.

In another aspect, the present invention provides a method of preparing an x-ray mask comprising providing a substrate, and applying sequentially to a surface of the substrate i) an etch stop layer resistant to etchant for an x-ray absorber, and ii) an x-ray absorber layer. The method then includes removing a portion of the substrate below the layers to create an active region of the substrate above the removed portion of the substrate and an inactive region over remaining portions of the substrate, applying a resist layer above the absorber layer, and exposing a portion of the resist layer using electron beam irradiation and developing the resist layer to form a latent mask image over the active region of the substrate. The method then includes removing the exposed portion of the resist layer to leave a resist layer mask image over the active region of the substrate, and etching the absorber layer to leave an absorber layer mask image over the designated active region of the substrate while simultaneously removing the absorber layer from the inactive region to increase the effective pattern density during etching.

The method optionally includes applying a hardmask layer over the x-ray absorber layer and etching the hardmask layer to leave a hardmask layer mask image over the active region of the substrate while separately removing the hardmask layer from the inactive region. The hardmask layer may also be applied only over the active region of the substrate by masking the inactive region of the substrate to prevent application of the hardmask layer.

Preferably, the resist is a positive photoresist, and the method further includes exposing the inactive region with electron beam irradiation or UV light. The substrate may include a membrane layer on the surface wherein the membrane layer is not removed during removal of the substrate to create the active region.

Etchant byproducts used during etching of the absorber layer may be monitored for presence of absorber material used in the absorber layer to determine an endpoint for the etching. Additional absorber may be provided adjacent the substrate and the additional absorber may be etched while etching the absorber on the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
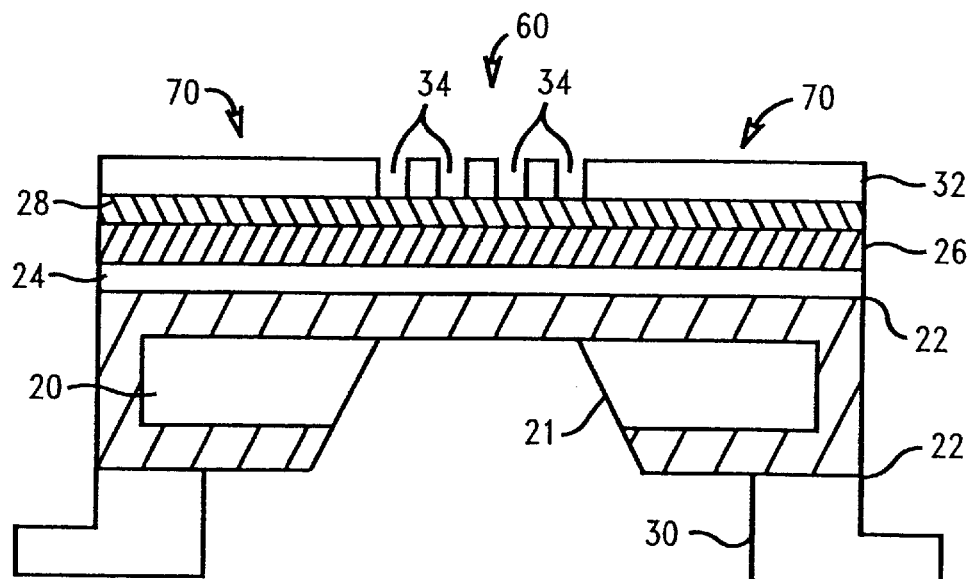
FIGS. 1 and 2 are side elevational views of the process of forming a lithography mask in accordance with the prior art.
Figure 2:
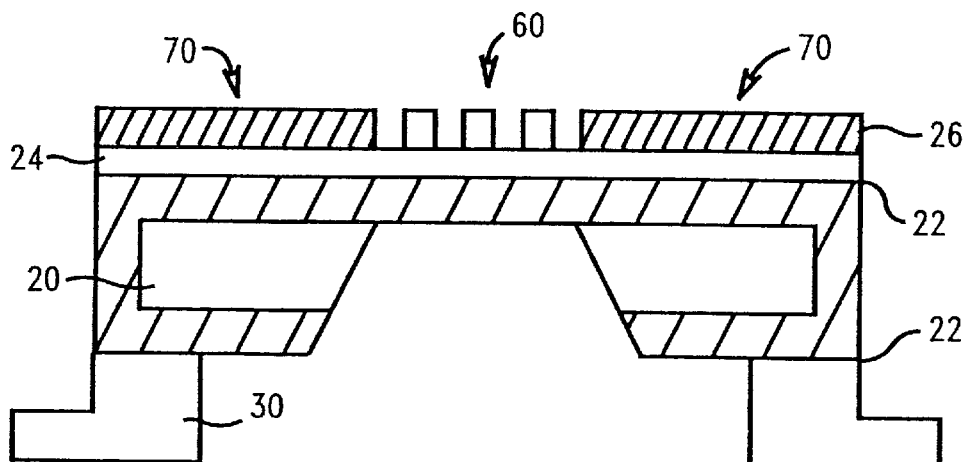

In describing the preferred embodiment of the present invention, reference will be made herein to FIGS. 3–12 of the drawings in which like numerals refer to like features of the invention. Features of the invention are not necessarily shown to scale in the drawings.

The present invention provides a process which enables efficient plasma etching of low pattern density, advanced lithographic masks. The primary application of this process is for x-ray lithography masks, but the same process may also be used on masks for other advanced lithographies such as SCALPEL or EUV.

A typical prior art solution to etching masks or wafers with low pattern density is to optimize the etch process parameters. Parameters such as RF power, gas flows and substrate temperature may be adjusted to alter the plasma in such a way that it will more efficiently etch the isolated and low density features. In some cases, and in particular with refractory metal etching, these parameter adjustments result in a more aggressive etch and a reduced selectively to the hard mask. Even with a thicker hardmask, it is still very difficult to pattern features with large aspect ratios, and the resulting image quality can be poor.

Unexpectedly, the present invention has been found to provide an alternate solution to etching masks with this problem. The solution involves a method to increase and precisely tailor the effective pattern density without altering the actual mask pattern. In order to increase the effective pattern density seen at the refractory etch step it has been found effective to clear the hardmask film from the extraneous portions of the mask that are not related to the chip pattern, i.e., the inactive wafer regions. In x-ray masks, this means clearing the hardmask material from the non-membrane portions of the mask prior to the absorber etch. An added benefit of this approach is that it results in a larger amount of material being etched, thereby greatly increasing the functionality of many endpoint monitoring systems that use plasma optical emission detection schemes.

There have been found several methods which can be used to clear the extraneous hardmask film. One method is to perform an extra exposure of the resist so that it will be developed away, and then etched away during the regular hardmask etch step. The extra exposure step can be performed directly with an electron beam tool before or after writing the mask pattern. Different exposure areas can be used depending on the required overall pattern density. Alternatively, to improve throughout, a UV lamp can be used to blanket expose the resist after electron beam exposure, as long as the central active (membrane) portion of the mask is blocked off. Another method to clear the extra hardmask film is to perform a second hardmask etch step, prior to the absorber etch, with the central active (membrane) portion of the mask blocked off. It is also possible to mask the mask blank during the deposition step (FIG. 4), so the extra hardmask film is not placed on the wafer in the mask blank processing steps.

Another alternative to cleaning the extra hardmask film from the mask is to place a second wafer or similar source containing the refractory metal film together with the mask during the absorber etch process. In this way, the total amount of refractory metal seen during the etch is increased and this has the same effect as increasing the pattern density.

Implementing one or more of these processes results in a high total mask effective pattern density, even when a low coverage mask pattern is written. Using these processes it is also possible to custom tailor the overall pattern density, which may be required on some advanced masks. For example, it is possible to tailor mask pattern density in different areas that require more or less aggressive etching. Because of the etch processes, this would also provide a way of tailoring image size, image bias or sidewall across the mask, if desired. It is considerably easier to etch higher density patterns, and with this solution it will be possible to fabricate all types of mask patterns with feature sizes down to 0.1 μm and beyond.

FIGS. 3–10 depict process flow in accordance with the present invention.

Figure 3:
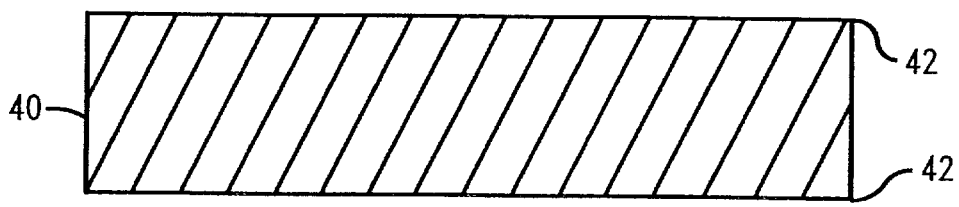
FIGS. 3–10 are side elevational views of a substrate wafer showing the sequential processing to form a lithographic mask in accordance with the present invention.
Figure 4:
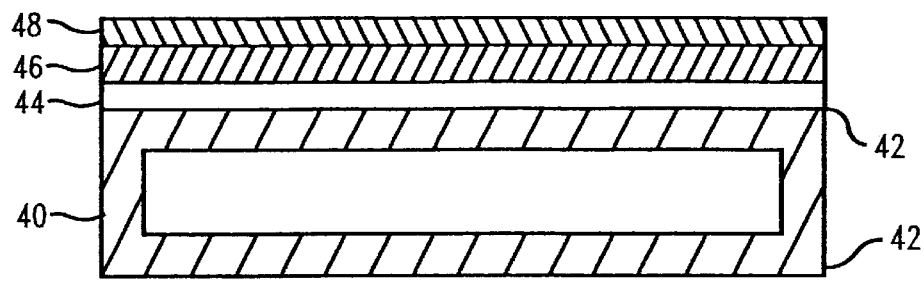

In FIG. 3, a silicon wafer 40 is provided which has upper and lower membrane layers 42 preferably of silicon carbide, boron doped silicon, thin diamond film or the like of approximately 2 micron thickness. In FIG. 4 there is shown the deposition by conventional methods in sequence on the upper membrane layer 42 of an etch stop layer, for example chromium in a thickness of 20 nm, then an x-ray absorber layer of, for example, tantalum silicon (TaSi) of approximately 500 nm thickness, followed by deposition of a hard mask layer of for example, silicon oxynitride (SiON), of approximately 200 nm thickness.

Figure 5:
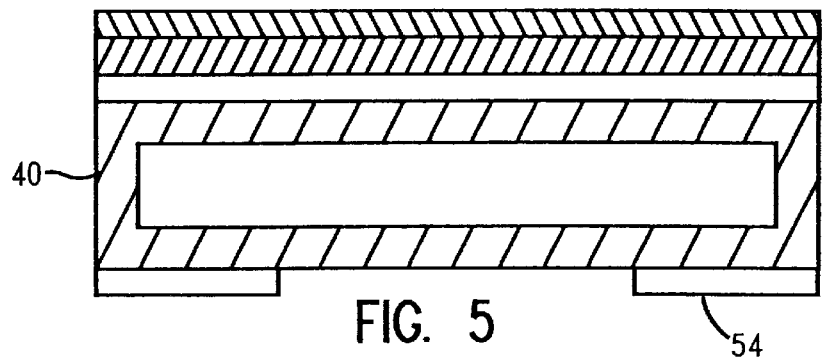
Figure 6:
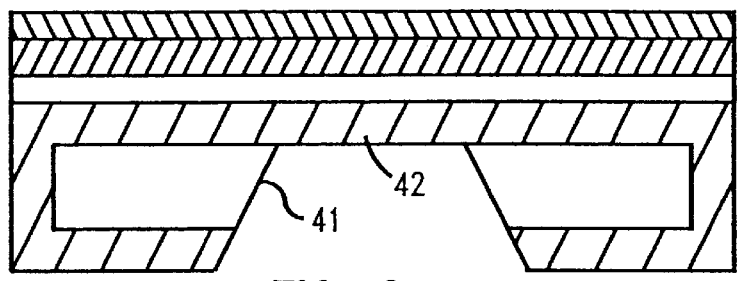

In FIG. 5 there is shown the patterning of the back or lower side of the wafer with an optical resist layer 54 which leaves an open area in the center of the lower portion of wafer 40. In FIG. 6, there is shown the etching of the lower portion of the silicon wafer 40 to form inner walls 41 which exposes the lower surface of upper membrane layer 42 in the central region of the wafer below the active region 60. The optical resist layer may be removed by conventional means.

Figure 7:
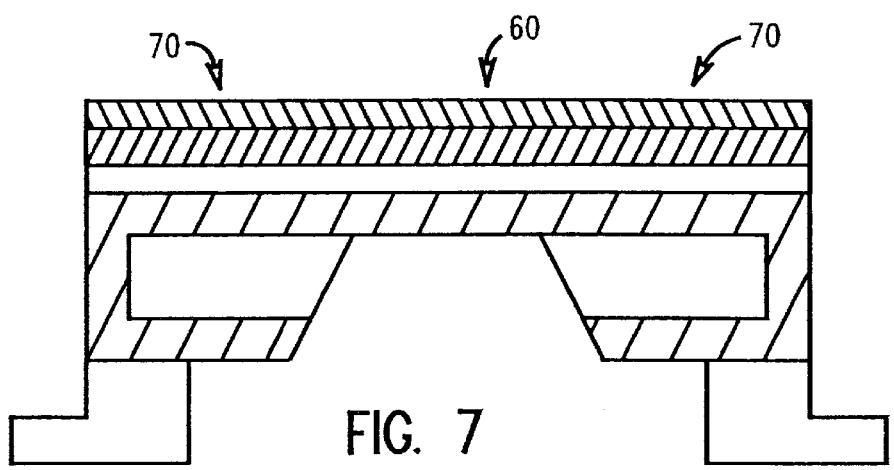

In FIG. 7 there is shown the bonding of the lower portion of the wafer to a supporting ring of pyrex or NIST which is done at an elevated temperature and in an electric field to provide anodic bonding between the wafer and the ring material.

Figure 8:
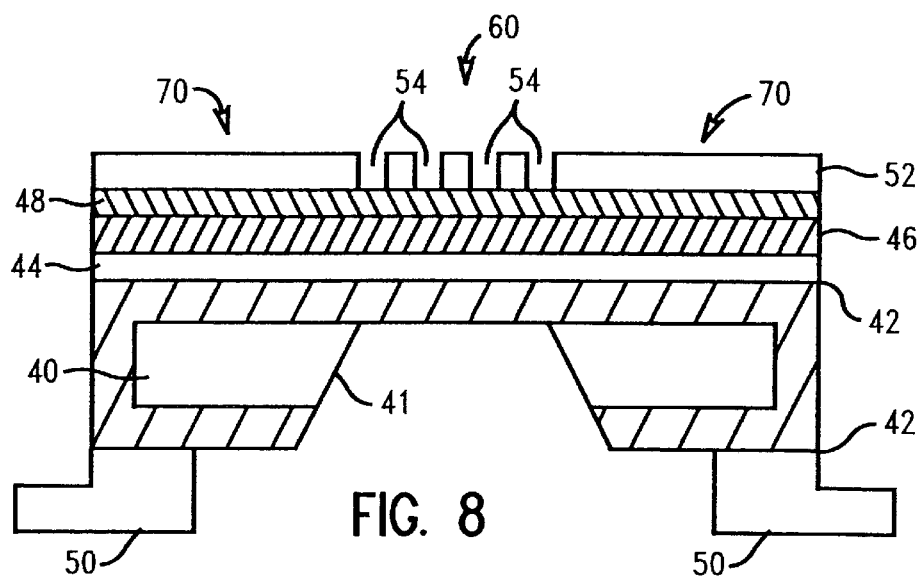
Figure 9:
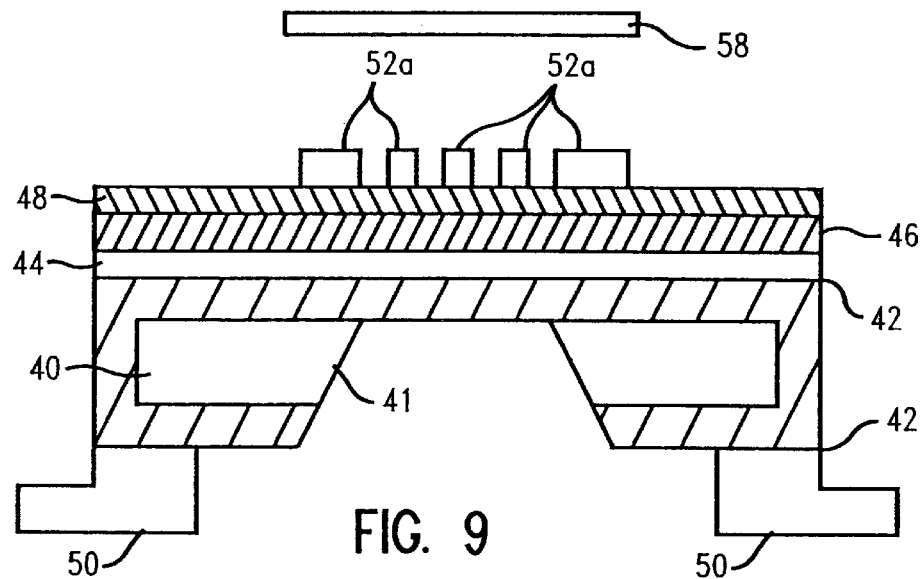
Figure 10:
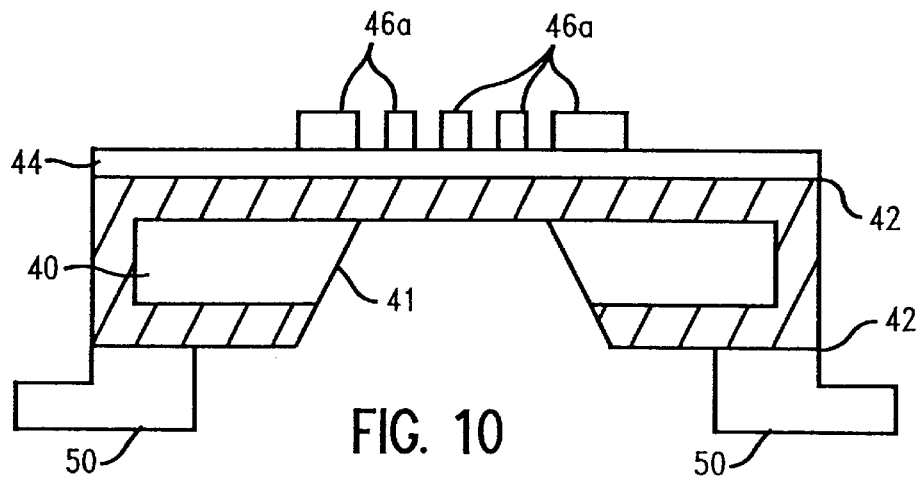

FIGS. 8–10 show one embodiment of the method of making a lithographic mask in accordance with the present invention. In FIG. 8 there is shown a workpiece or wafer substrate 40 of silicon or the like which has upper and lower hard membrane layers 42 made of silicon carbide, silicon nitride, boron-doped silicon, diamond film or the like. A cutout 41 on the lower portion of the substrate wafer exposes the bottom portion of the wafer up to the lower surface of the upper membrane layer 42. The portion of the layers above the substrate cutout area 41 are indicated as being the active region 60 where the mask features are to be made and the regions outside of the active region above the substrate 40 thickness are shown as the inactive regions 70. The wafer is mounted on a pyrex ring 50 for handling purposes.

Above upper membrane layer 42 there is deposited, in sequence, directly one upon the other, optional etch stop layer 44, x-ray absorber layer 46, optional hardmask layer 48 and resist layer 52. Initially, resist layer 52 is applied over the entire upper surface of the workpiece, including the active and inactive regions. Resist layer 52 has openings 54 which have been made as a result of electron beam exposure, baking, developing and removal of the desired portions. It should be noted that preferably the present invention utilizes a positive resist layer 52 in which the electron beam irradiates or writes only those portions 54 where openings are to be formed after developing and resist and removal. However, it is possible to have low pattern density with a negative resist. Using a negative resist, one may write the opposite tone using an electron beam to cover all the extra portions of the active area where openings are not to be formed.

As shown by way of example only for use with positive photoresist, the electron beam radiation has exposed the entire inactive region and a portion of the active region so that, as shown in FIG. 8, the photoresist layer is removed from at least a portion of and preferably the entire inactive region, as well as active region openings 54. Instead of electron beam radiation, ultraviolet (UV) light may also be employed.

Etch stop layer 42 is optional and may be made from chromium and deposited by conventional techniques in a preferred thickness of about 25 nm. X-ray absorber layer 46 may be made from tantalum silicon (TaSi) or similar refractory material and deposited by conventional techniques in a preferred thickness of about 500 nm. Hardmask layer 48 is also optional and may be made from silicon oxynitride (SiON), which is differentially etchable with respect to absorber layer 46, and deposited by conventional techniques in a preferred thickness of about 200 nm.

As can be seen in FIG. 9, a blocking material or mask 58 may be utilized to block the active portion 60 of the resist layer while being exposed in a manner to remove the portions of the resist layer 52 in the inactive regions, leaving desired resist portions 52a. Ultraviolet (UV) radiation may be used to expose the resist in the inactive regions. Resist portions 5a are then used as a mask to remove selected portions of the hardmask 48 below.

Subsequently, there is shown in FIG. 10 the removal of portions of the workpiece using remaining photoresist to form mask image segments in active region 60. FIG. 10 depicts the substrate and mask layer after the hardmask etch, absorber etch and stripping of the remaining resist layers and hardmask layer. Etching of the hardmask layer 48 is by conventional techniques, such as reactive ion etching (RIE). The remaining hardmask portions below resist portions 52a in turn provide the mask for etching the absorber layer 46. The etching of the absorber layer is preferably by plasma etching and continues until the etch stop layer 44 is reached. What results is a dark field x-ray lithographic mask having absorber portions 46a, corresponding to the configuration of original resist portions 52a, forming the desired dark field mask image.

Figure 11:
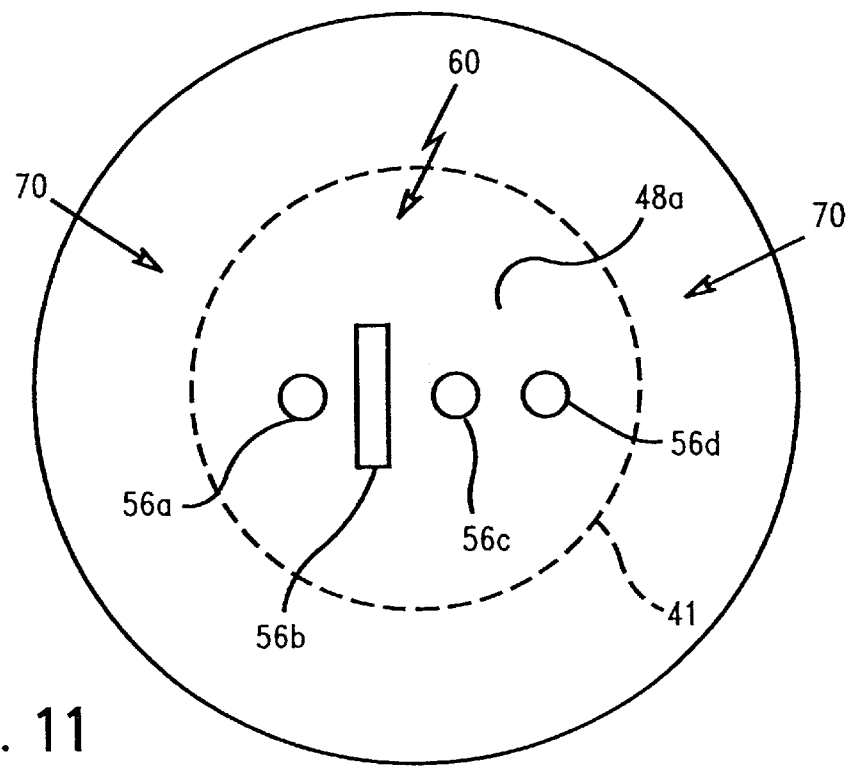
FIG. 11 is a top plan view of a finished lithographic mask made in accordance with the present invention which shows the active and inactive areas of the wafer surface.

The resultant mask is shown in top plan view in FIG. 11 which shows the x-ray absorber material 48a in the desired configuration with openings 56a, 56b, 56c, and 56d of various desired configurations. X-ray absorber material 48a extends at least over the entire central active region 60 of the mask. In the surrounding inactive region 70, there is no absorber layer.

During the plasma etching of the absorber material, it has been found that etching the additional amount of absorber material over the inactive region 70 at the same time the absorber material is etched over active region 60 provides for a more effective etching. Additionally, the detection in the etching plasma of the etched absorber material, for example tantalum etch byproducts, makes it easier to determine the endpoint of the absorber etching step.

Figure 12:
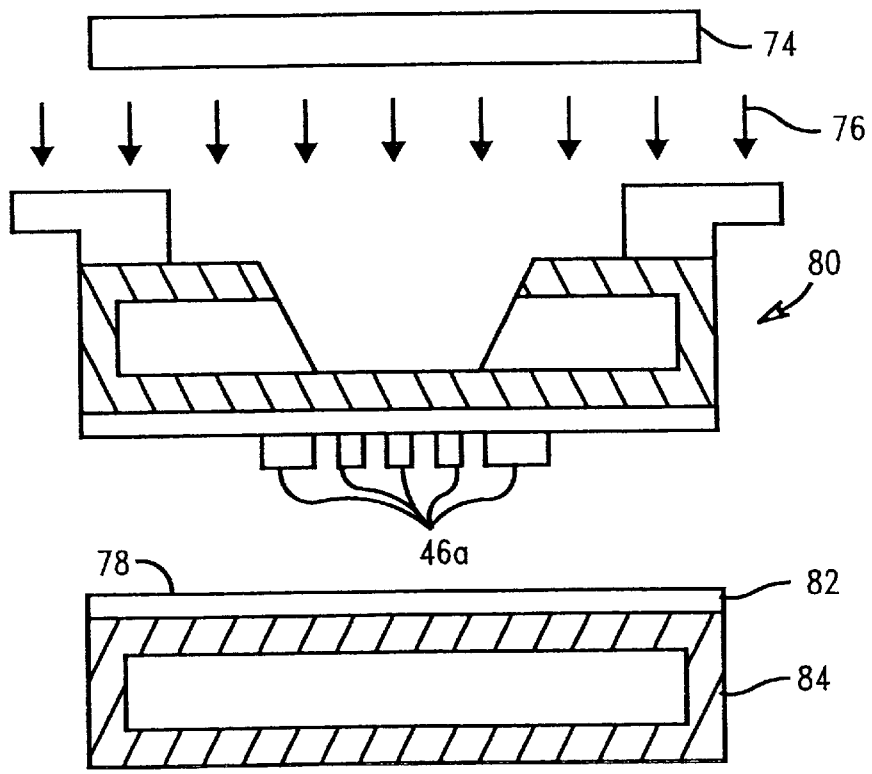
FIG. 12 is a side elevational, partially schematic view of a dark field x-ray lithographic mask of the present invention as used to expose a resist layer during lithographic processing.

The present invention is particularly useful to produce a dark field x-ray mask. As shown in FIG. 12, the dark field x-ray mask 80 made in accordance with the present invention is used with an x-ray source 74 which emits x-ray beams 76 of, for example, 1 nm wavelength. X-ray mask 80 is positioned approximately 10–20 μm over wafer 84. The mask is made of, for example a 2 μm thickness SiC layer having thereon x-ray absorber portions 81 of 0.5 μm thickness TaSi. Beams 76 produce a dark field image 78 on the resist layer 82 of substrate 84 which may be subsequently lithographically processed to produce a microelectronic or other component.

Additionally, one may use a negative resist layer on the wafer, instead of the typical positive resist, and write or create the dark field pattern, including the extra portions needed to cover the membrane edge. In this manner the active field may be completely blocked off except for the desired chip pattern, and would have the effect of improving the etch.

The particular advantages provided by the present invention are that the etching of the tantalum silicon absorber material utilizes lower power, on the order of 50–80 watts, and at lower temperatures, on the order of 35° C. while retaining a high selectivity to silicon oxynitride (on the order of greater than eight to one). Additionally, image size resolution as low as 75 nm may be achieved and image size control is better, i.e., typically 170–190 nm actual for 180 nm nominal images. Further, the etched sidewalls of the remaining absorber portions are more vertically oriented and, as described previously, there is a higher resolution for optical endpoint systems which monitor the etching process. The present invention may be used to produce masks on wafer substrates having multiple active and inactive regions.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming image segments comprising:
   a) providing a workpiece having an absorber layer, said workpiece having active and inactive surface regions;
   b) applying a photoresist over the workpiece covering both active and inactive regions;
   c) exposing and developing a portion of the photoresist at least in the active region to create mask pattern images thereover;
   d) removing the photoresist from the entire inactive region, thereby leaving a remaining photoresist mask image over the active region of the workpiece; and
   e) removing portions of the workpiece over said active region using the remaining photoresist mask image to form image segments in said active region of the workpiece while simultaneously removing the absorber layer from the entire inactive region, said image segments in the active region being formed and removed subsequent to removal of said photoresist from said entire inactive region thereby increasing the effective pattern density of said image segments in the active region.

2. The method of claim 1 wherein said photoresist is a positive photoresist.

3. The method of claim 1 wherein said image segments form an x-ray mask.

4. The method of claim 1 wherein said image segments form a dark field x-ray mask.

5. The method of claim 1 wherein mask pattern images of the active region are patterned by electron beam irradiation.

6. The method of claim 1 further including blocking the active region while exposing and developing the inactive region.

7. The method of claim 1 further including masking the active region while removing photoresist from the inactive region.

8. The method of claim 1 wherein said photoresist is a positive photoresist and the active region is patterned using electron beam irradiation, and further including exposing the inactive region with electron beam irradiation or UV light.

9. The method of claim 1 including applying an absorber prior to applying the photoresist and using the remaining photoresist as a mask to leave portions of the absorber on the workpiece to form a lithographic mask.

10. The method of claim 9 wherein the absorber is an x-ray absorber and the absorber forms an x-ray mask.

11. The method of claim 10 further including the step of applying a hardmask layer to said workpiece prior to applying said photoresist and the step of removing portions of the hardmask layer using the remaining photoresist as a mask.

12. The method of claim 1 wherein said photoresist is a negative photoresist and further including writing an opposite tone using electron beam irradiation to cover a portion of the active region where openings are not to be formed.

13. A method of forming image segments comprising:
   a) providing a substrate having an absorber layer thereover;
   b) removing a portion of said substrate below said absorber layer to create an active region of said substrate above the removed portion of the substrate and an inactive region over remaining portions of the substrate;
   c) applying a photoresist over the absorber layer covering both the active and inactive regions;
   d) exposing and developing a portion of said photoresist at least in the active region to create photoresist mask image segments thereover;
   e) removing the photoresist from the entire inactive region, thereby leaving a remaining photoresist mask image segment over said active region of the substrate, said remaining photoresist image segment defining absorber layer image segments in the underlying absorber layer; and
   f) etching and removing portions of the underlying absorber layer in the active region using the remaining photoresist mask image segment to form said absorber layer image segments in the active region of the substrate while simultaneously removing the absorber layer in the entire inactive region of the substrate, said absorber layer image segments in the active region being formed and removed subsequent to removal of said photoresist from said entire inactive region thereby increasing the effective pattern density of said absorber layer image segments in the active region.

14. The method of claim 13 further comprising depositing an etch stop layer over said substrate prior to depositing said absorber layer, said etch stop layer being resistant to etchant for said absorber layer.

15. The method of claim 14 wherein said absorber layer image segments comprise lithographic masks.

16. The method of claim 13 further including blocking the active region while exposing and developing the inactive region.

17. The method of claim 13 wherein said photoresist is a positive photoresist and the active region is patterned using electron beam irradiation, and further including exposing the inactive region with electron beam irradiation or UV light.

18. The method of claim 13 wherein said photoresist is a negative photoresist and further including writing an opposite tone using electron beam irradiation to cover a portion of the active region where openings are not to be formed.

19. The method of claim 13 further including applying a hardmask layer over the absorber layer and, between steps (e) and (f), etching the hardmask layer to leave a hardmask layer mask image over the active region of the substrate while separately removing the hardmask layer from the inactive region.

20. The method of claim 13 further including monitoring etchant byproducts used during etching of the absorber layer for presence of absorber material used in the absorber layer to determine an endpoint for the etching.

* * * * *